United States Patent
Zoppi et al.

(10) Patent No.: US 12,316,325 B2
(45) Date of Patent: May 27, 2025

(54) CIRCUITS AND METHODS FOR DEBOUNCING SIGNALS PRODUCED BY A ROTARY ENCODER

(71) Applicants: STMicroelectronics S.r.l., Agrate Brianza (IT); STMicroelectronics (Rousset) SAS, Rousset (FR)

(72) Inventors: Giulio Zoppi, Palermo (IT); Vincent Pascal Onde, Fuveau (FR); Giuseppe Romano, Palermo (IT)

(73) Assignees: STMicroelectronics S.r.l., Agrate Brianza (IT); STMicroelectronics (Rousset) SAS, Rousset (FR)

( * ) Notice: Subject to any disclaimer, the term of this patent is extended or adjusted under 35 U.S.C. 154(b) by 10 days.

(21) Appl. No.: 18/127,397

(22) Filed: Mar. 28, 2023

(65) Prior Publication Data

US 2023/0318589 A1    Oct. 5, 2023

(30) Foreign Application Priority Data

Apr. 1, 2022 (IT) .......................... 102022000006461

(51) Int. Cl.
  *H03K 5/1254* (2006.01)
  *G01D 5/347* (2006.01)
  *H03K 3/013* (2006.01)

(52) U.S. Cl.
  CPC ......... *H03K 5/1254* (2013.01); *G01D 5/3473* (2013.01); *H03K 3/013* (2013.01)

(58) Field of Classification Search
  CPC .... H03K 5/1254; H03K 5/125; H03K 5/1252; H03K 5/1534; H03K 3/013; H03M 1/0617
  See application file for complete search history.

(56) References Cited

U.S. PATENT DOCUMENTS

| | | | |
|---|---|---|---|
| 4,403,193 A | 9/1983 | Takemura | |
| 5,963,652 A * | 10/1999 | Tran | H03G 1/02 381/306 |
| 2002/0036629 A1 | 3/2002 | Marnfeldt | |
| 2006/0076984 A1 | 4/2006 | Lu et al. | |
| 2007/0217559 A1 * | 9/2007 | Stott | H04L 7/0008 375/355 |

(Continued)

OTHER PUBLICATIONS

EP Search Report and Written Opinion for counterpart EP Appl. No. 23305371.9, report dated Aug. 25, 2023, 19 pgs.

(Continued)

*Primary Examiner* — Sibin Chen
(74) *Attorney, Agent, or Firm* — Crowe & Dunlevy LLC

(57) ABSTRACT

A first input node receives a first input signal and a second input node receives a second input signal. The first and second input signals are in phase quadrature. An edge detector circuit senses the first input signal and produces a pulsed signal indicative of edges detected in the first input signal. A pulse skip and reset circuit senses the pulsed signal and the second input signal, and produces a reset signal indicative of pulses detected in the pulsed signal while the second input signal is de-asserted. A sampling circuit senses the second input signal and the reset signal, and produces an output signal that is deasserted in response to assertion of the second input signal and is asserted in response to a pulse being detected in the reset signal.

18 Claims, 9 Drawing Sheets

(56) References Cited

U.S. PATENT DOCUMENTS

2015/0365103 A1* 12/2015 Kang .................. H03M 7/3059
                                                                  187/394
2016/0087615 A1    3/2016 Todd
2020/0186323 A1*  6/2020 Huang .................... H03M 9/00

OTHER PUBLICATIONS

Wettroth J: "The Dirt on Switching", Electronics World, Nexus Media Communications, Swanley, Kent, GB, vol. 105, No. 1763, Nov. 1, 1999 (Nov. 1, 1999), pp. 938-940, XP000920267.
IT Search Report and Written Opinion for priority application, IT Appl. 102022000006461, report dated Nov. 24, 2022, 13 pgs.

* cited by examiner

CIRCUITS AND METHODS FOR DEBOUNCING SIGNALS PRODUCED BY A ROTARY ENCODER

PRIORITY CLAIM

This application claims the priority benefit of Italian Application for Patent No. 102022000006461 filed on Apr. 1, 2022, the content of which is hereby incorporated by reference in its entirety to the maximum extent allowable by law.

TECHNICAL FIELD

The description relates to circuits and methods for debouncing signals produced by rotary encoders (e.g., quadrature rotary encoders).

BACKGROUND

A rotary encoder is an electro-mechanical device that converts the angular position or motion of a shaft or axle to analog or digital output signals.

There are two main types of rotary encoder: absolute and incremental. The output of an absolute encoder indicates the current shaft position, substantially making it an angle transducer. The output of an incremental encoder provides information about motion of the shaft, which typically is processed elsewhere into information such as speed and distance travelled and, optionally, position.

A quadrature encoder is an incremental rotary encoder that has two output channels, which issue respective digital signals (e.g., A and B) whose values depend on the angular position of the encoder shaft. The relationship between the angular position of the encoder shaft and the values of the two output signals is such that the two output signals produce (periodic) digital waveforms in phase quadrature when the encoder shaft rotates (at constant speed). Each channel provides a specific number of equally spaced pulses per revolution; therefore, the waveform frequency indicates the speed of shaft rotation and the number of pulses indicates the distance travelled, whereas the phase relationship between signals A and B indicates the direction of rotation. For instance, when the encoder is rotating in a clockwise direction its signals will show channel A leading channel B, and the reverse will happen when the encoder rotates in a counterclockwise direction.

Incremental rotary encoders may use mechanical, optical or magnetic sensors to detect angular position changes. In particular, encoders equipped with mechanical sensors suffer from bouncing effects (e.g., due to the uncertain movement of the hand of a user manually acting on the encoder) that may last even some milliseconds after the signal transitions, and may thus affect the decoding of the quadrature waveforms. A microcontroller or other processing circuit coupled to the rotary encoder to receive the quadrature signals and decode the information carried thereby may need clean input signals (i.e., bounce-free signals) in order to correctly operate (e.g., update) the counter and direction detectors without uncertainties. Therefore, rotary encoders (mainly the mechanical ones, but not only) rely on debouncing circuitry.

For instance, FIG. 1 is a circuit block diagram exemplary of a system including a rotary encoder 10, a dedicated debouncing (or debouncer) circuit (DC) 12, and a microcontroller unit (MCU) 14 implementing a decoder functionality. The rotary encoder 10 produces quadrature signals A and B, possibly affected by bouncing effects. The debouncing circuit 12 receives signals A and B and applies a debouncing processing thereto to produce filtered (e.g., debounced, clean) quadrature signals A' and B'. The microcontroller unit 14 receives the filtered quadrature signals A' and B' and decodes them to reconstruct information about the speed and direction of movement of the rotary encoder 10.

FIG. 2 is a circuit block diagram exemplary of another system, which includes a rotary encoder 10, a dedicated (e.g., external) microcontroller unit (MCU1) 22, and a microcontroller unit (MCU2) 24 implementing a decoder functionality. The rotary encoder 10 produces quadrature signals A and B, possibly affected by bouncing effects. The dedicated microcontroller unit 22 receives signals A and B and applies a software debouncing processing thereto to produce one or more digital signals S carrying clean information. The microcontroller unit 24 receives the clean digital signals S via a communication bus (e.g., a serial peripheral interface, SPI, or an Inter-Integrated Circuit bus, I2C) and decodes them to reconstruct information about the speed and direction of movement of the rotary encoder 10. The microcontroller unit 24 is therefore offloaded from the heavy and complex task of signal debouncing. In this example, the entire processing capability of the dedicated microcontroller unit 22 is dedicated to debouncing and decoding signals A and B output by the encoder 10. The decoded data (e.g., the direction of the single step) can be forwarded by calling an interrupt. Depending on the application, other communication schemes may also be implemented, such as a periodic stream of the number of steps decoded in a given amount of time (speed) provided via a standard dedicated interface such as I2C or SPI.

FIG. 3 is a circuit block diagram exemplary of another system, which includes a rotary encoder 10 and a microcontroller unit (MCU) 32 implementing a decoder functionality. The rotary encoder 10 produces quadrature signals A and B, possibly affected by bouncing effects. The microcontroller unit 32 receives signals A and B, applies a software debouncing processing thereto (e.g., via a basic counter-based digital filter), and decodes the clean signals to reconstruct information about the speed and direction of movement of the rotary encoder 10. In this example, the microcontroller unit 32 includes a dedicated decoding hardware IP block, which typically is designed to decode the movement of a shaft of an electric motor that does not suffer from bouncing effects (e.g., because the shaft is not operated by the hand of a user). Therefore, even with a heavy capacitive load, the results may be disappointing.

The architectures exemplified in FIGS. 1 to 3 (e.g., based on an external microcontroller dedicated to poll the encoders or on external debouncing integrated circuits such as the integrated circuits commercially available under the designations MC14490 and MAX681x) may be costly in terms of bill of materials (BoM), board and firmware development.

On the other hand, RC filtering of the quadrature signals A and B is possible but not always effective, particularly in hand-driven applications where unpredictable trains of pulses may take place in signals A and B, thus limiting the speed range of the decoding.

Therefore, there is a need in the art to provide improved debouncing circuits and methods for debouncing the signals produced by a rotary encoder.

There is a need in the art to contribute in providing such improved debouncing solutions.

SUMMARY

One or more embodiments may relate to debouncing circuits.

One or more embodiments may relate to corresponding methods of debouncing signals.

In one or more embodiments, a circuit configured to debounce signals produced, for example, by a quadrature encoder includes a first input node configured to receive a first input signal and a second input node configured to receive a second input signal. The first input signal and the second input signal are in phase quadrature. The circuit includes an edge detector circuit configured to sense the first input signal and produce a pulsed signal indicative of edges detected in the first input signal. The circuit includes a pulse skip and reset circuit configured to sense the pulsed signal and the second input signal and produce a reset signal indicative of pulses detected in the pulsed signal (only) while the second input signal is de-asserted. The circuit includes a sampling circuit configured to sense the second input signal and the reset signal, and produce an output signal by de-asserting the output signal in response to assertion of the second input signal and asserting the output signal in response to a pulse being detected in the reset signal.

One or more embodiments may thus facilitate debouncing the signals of a rotary encoder with a simple, inexpensive and fast logic, without implementing a timer, and self-adapting the debouncing period to pulse period changes.

In one or more embodiments, the edge detector circuit is configured to maintain the pulsed signal normally de-asserted and assert pulses in the pulsed signal in response to rising edges and falling edges detected in the first input signal.

In one or more embodiments, the pulse skip and reset circuit is configured to maintain the reset signal normally de-asserted and assert a pulse in the reset signal in response to each pulse detected in the pulsed signal while the second input signal is de-asserted.

In one or more embodiments, the sampling circuit is configured to receive the second input signal at a respective clock input terminal and receive the reset signal at a respective reset input terminal.

In one or more embodiments, the edge detector circuit includes a delay circuit configured to produce a delayed replica of the first input signal. The edge detector circuit further includes an exclusive-NOR logic gate or an exclusive-OR logic gate configured to apply exclusive-NOR signal processing or exclusive-OR signal processing to the first input signal and the delayed replica of the first input signal to produce the pulsed signal.

In one or more embodiments, the pulse skip and reset circuit includes a NOR logic gate or an OR logic gate configured to apply NOR signal processing or OR signal processing to the pulsed signal and the second input signal to produce the reset signal.

In one or more embodiments, the sampling circuit includes a flip-flop (e.g., a D flip-flop or a JK flip-flop) configured to receive the second input signal at a respective clock input terminal, receive the reset signal at a respective clear input terminal, receive a data input signal having a fixed logic value at a respective data input terminal, receive a preset input signal having a fixed logic value (e.g., opposite to the value of the data input signal) at a respective preset input terminal, and produce the output signal at a respective data output terminal.

In one or more embodiments, the circuit includes a delay circuit configured to delay propagation of the reset signal from the pulse skip and reset circuit to the sampling circuit.

According to other aspects of the present disclosure, a circuit configured to debounce a signal produced, for example, by a quadrature encoder includes an input node configured to receive an input signal. The circuit includes a timer circuit configured to be started in response to an edge being detected in the input signal and be stopped after a debouncing time interval having a certain duration. The circuit includes an output node configured to produce an output signal. The circuit is configured to pass the input signal from the input node to the output node while the timer circuit is not running, and to prevent the output signal from changing value while the timer circuit is running.

One or more embodiments may thus facilitate debouncing the signals of a rotary encoder without introducing substantive delay during the debouncing processing, and allowing use of the full encoder resolution.

In one or more embodiments, the timer circuit includes a counter circuit (e.g., a single-shot non-retriggerable counter) configured to start counting in response to an edge being detected in the input signal and stop counting in response to the count number of the counter circuit reaching a threshold value.

In one or more embodiments, the circuit includes an edge detector circuit configured to sense the input signal and produce a pulsed signal indicative of edges detected in the input signal, and the timer circuit is configured to be started in response to a pulse being detected in the pulsed signal.

In one or more embodiments, the circuit further includes an adjustment circuit configured to receive a clock signal, measure a period of the clock signal, and set the duration of the debouncing time interval as a function of the measured period of the clock signal, optionally as a fraction of the measured period of the clock signal.

One or more embodiments may thus facilitate debouncing the signals of a rotary encoder without introducing substantive delay during the debouncing processing, allowing use of the full encoder resolution and providing an auto-adaptive debouncing interval.

In one or more embodiments, measuring a period of the clock signal comprises measuring the time elapsed between the last two pulses detected in the clock signal, or measuring an average value of a plurality of periods of the clock signal, optionally a moving average value.

In one or more embodiments, the adjustment circuit is further configured to cap the duration of the debouncing time interval to a maximum value.

In one or more embodiments, the circuit further includes a decoding logic circuit configured to receive the output signal and produce the clock signal by issuing a pulse in the clock signal in response to a rising edge and/or a falling edge being detected in the output signal.

In one or more embodiments, the circuit includes a further input node configured to receive a further input signal in phase quadrature with the input signal. The circuit includes a further timer circuit configured to be started in response to an edge being detected in the further input signal and be stopped after the debouncing time interval. The circuit includes a further output node configured to produce a further output signal. The circuit is configured to pass the further input signal from the further input node to the further output node while the further timer circuit is not running, and to prevent the further output signal from changing value while the further timer circuit is running. The decoding logic circuit is further configured to receive the further output signal and produce the clock signal by issuing a pulse in the clock signal in response to a rising edge and/or a falling edge being detected in the further output signal.

According to other aspects of the present disclosure, a method of debouncing quadrature signals produced by a quadrature encoder comprises: receiving a first input signal and a second input signal, wherein the first input signal and the second input signal are in phase quadrature; sensing the first input signal and producing a pulsed signal indicative of edges detected in the first input signal; sensing the pulsed signal and the second input signal, and producing a reset signal indicative of pulses detected in the pulsed signal while the second input signal is de-asserted; and sensing the second input signal and the reset signal, and producing an output signal by de-asserting the output signal in response to assertion of the second input signal and asserting the output signal in response to a pulse being detected in the reset signal.

According to other aspects of the present disclosure, a method of debouncing a signal produced by a quadrature encoder comprises: receiving an input signal; starting a timer in response to an edge being detected in the input signal and stopping the timer after a debouncing time interval having a certain duration; and producing an output signal by passing the input signal while the timer circuit is not running, and preventing the output signal from changing value while the timer circuit is running.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 4:
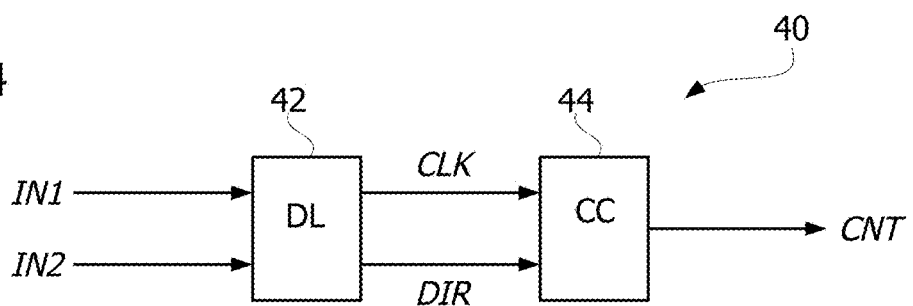
FIG. 4 is a circuit block diagram exemplary of decoding circuitry configured to decode quadrature signals produced by a rotary encoder.
Figure 5:
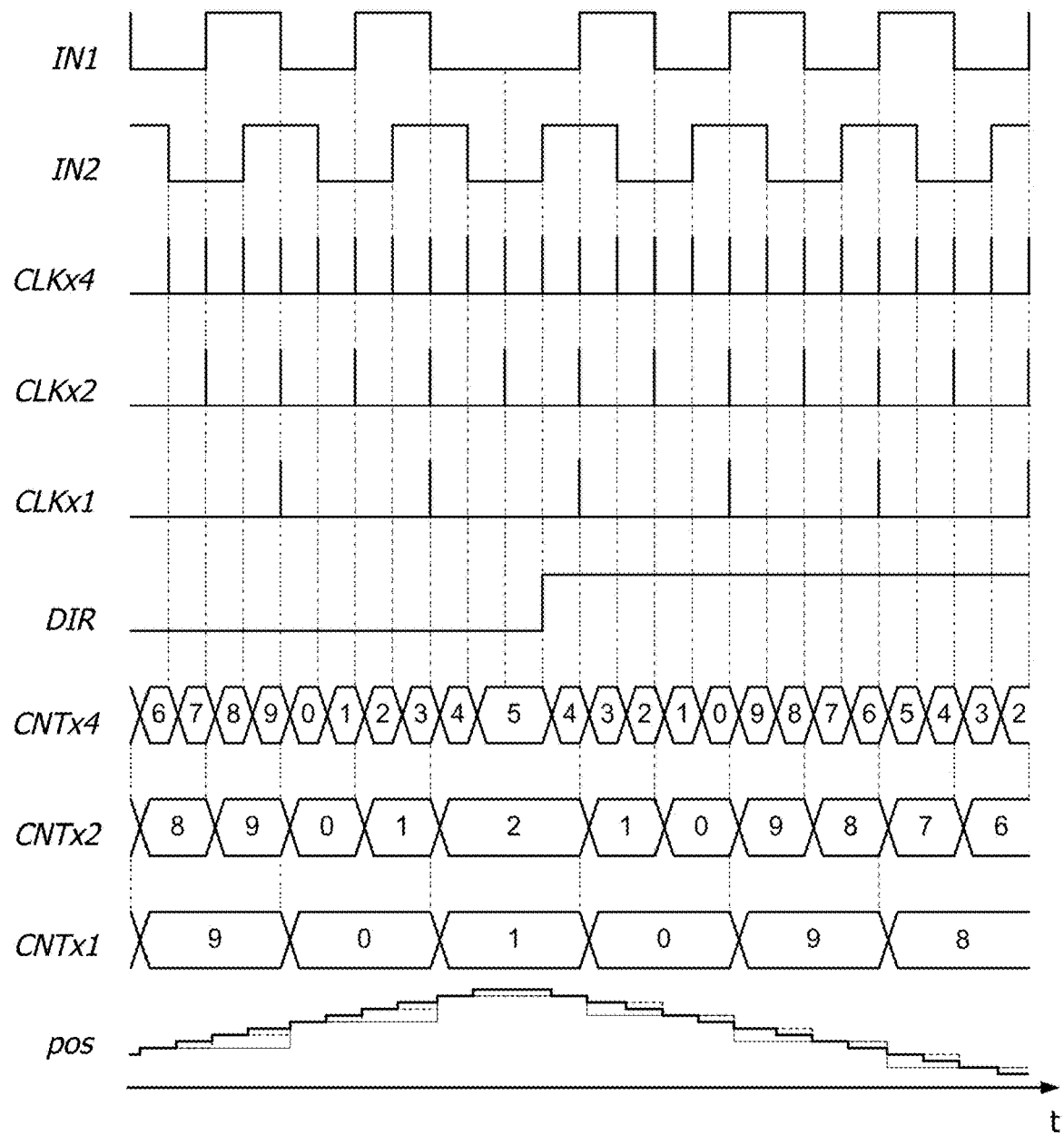
FIG. 5 is a time diagram exemplary of possible time evolution of signals in the decoding circuitry of FIG. 4.

By way of introduction to the detailed description of exemplary embodiments, reference may first be made to FIGS. 4 and 5. FIG. 4 is a circuit block diagram exemplary of decoding circuitry 40 configured to decode quadrature signals produced by a rotary encoder. FIG. 5 is a time diagram exemplary of possible time evolution of signals in the decoding circuit of FIG. 4.

Figure 1:
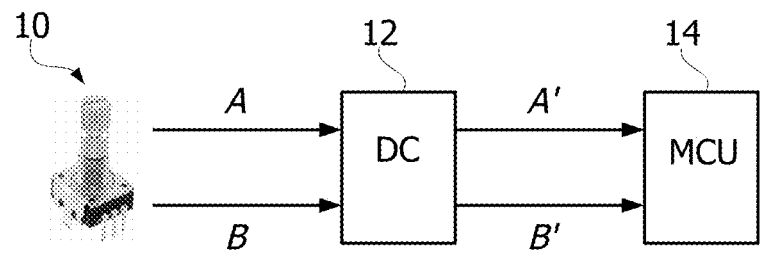
FIGS. 1 to 3, previously presented, are circuit block diagrams exemplary of various rotary encoder systems.
Figure 2:
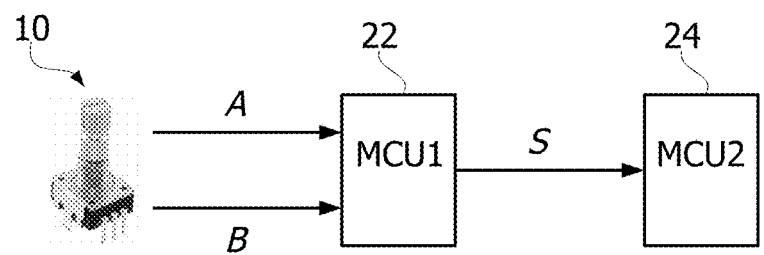
Figure 3:
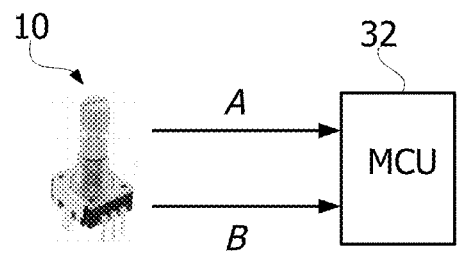

As exemplified in FIGS. 4 and 5, decoding circuitry 40 includes a decoding logic circuit (DL) 42 and a (bidirectional) counter circuit (CC) 44. The decoding logic circuit 42 is configured to receive two quadrature signals IN1 and IN2 (e.g., corresponding to quadrature signals A and B exemplified in FIGS. 1 to 3) produced, for example, by a quadrature rotary encoder, process the two quadrature signals IN1 and IN2, and produce a first output signal CLK (e.g., a clock signal) and a second output signal DIR.

The first output signal CLK of the decoding logic circuit 42 includes a train of pulses indicative of the rising and/or falling edges detected in the first quadrature signal IN1 and/or in the second quadrature signal IN2, depending on the operation mode of the decoding circuitry 40. Therefore, one or more edge detector circuits may be included in the decoding logic circuit 42 for producing signal CLK. For instance, in a first operation mode (also referred to as x1 mode) the decoding logic circuit 42 may be configured to produce an output signal CLKx1 including a pulse (only) at each falling edge (or rising edge) of signal IN1. In a second operation mode (also referred to as x2 mode), the decoding logic circuit 42 may be configured to produce an output signal CLKx2 including a pulse at each falling edge and each rising edge of signal IN1. In a third operation mode (also referred to as x4 mode), the decoding logic circuit 42 may be configured to produce an output signal CLKx4 including a pulse at each falling edge and each rising edge of both signals IN1 and IN2. By passing to (e.g., selecting) the x1 mode to the x2 mode or even to the x4 mode, the resolution of the encoder is increased.

The second output signal DIR of the decoding logic circuit 42 is indicative of the lagging/leading relationship of the signals IN1, IN2, for example as indicating the direction of rotation (clockwise or counterclockwise) of the encoder shaft, which is determined as a function of the phase shift between signals IN1 and IN2. For instance, as exemplified in FIG. 5, signal DIR may be set to a first value (e.g., a low logic value, '0') when the first quadrature signal IN1 leads in time (e.g., anticipates) the second quadrature signal IN2, and may be set to a second value (e.g., a high logic value, '1') when the first quadrature signal IN1 trails in time (e.g., follows) the second quadrature signal IN2.

Signal CLK (i.e., CLKx1, CLKx2 or CLKx4) and signal DIR are received by the counter circuit 44, which is triggered at each pulse of signal CLK to increase or decrease its (internal) count number to produce an output signal CNT (e.g., CNTx1, CNTx2 or CNTx4 as exemplified in FIG. 5, depending on the operation mode) that is indicative of the (relative) angular position of the encoder shaft. For instance, as exemplified in FIG. 5, counter 44 may increase its internal count number at each pulse of signal CLK if signal DIR has the first (e.g., low) value, and may decrease its internal count number at each pulse of signal CLK if signal DIR has the second (e.g., high) value. The value of the output signal CNT of the counter 44 can therefore be correlated to the (relative) angular position of the encoder shaft, exemplified by quantity pos in FIG. 5 (where a solid thick line is exemplary of the position detected in x4 mode, a dotted line is exemplary of the position detected in x2 mode, and a solid thin line is exemplary of the position detected in x1 mode).

As previously discussed, the quadrature signals IN1 and IN2 may suffer from bouncing effects, e.g., their transitions from one logic value to the other may include a plurality of edges. In that case, signal CLK would be incorrectly determined and would thus incorrectly trigger the counter circuit 44, resulting in an erroneous decoding.

Figure 6:
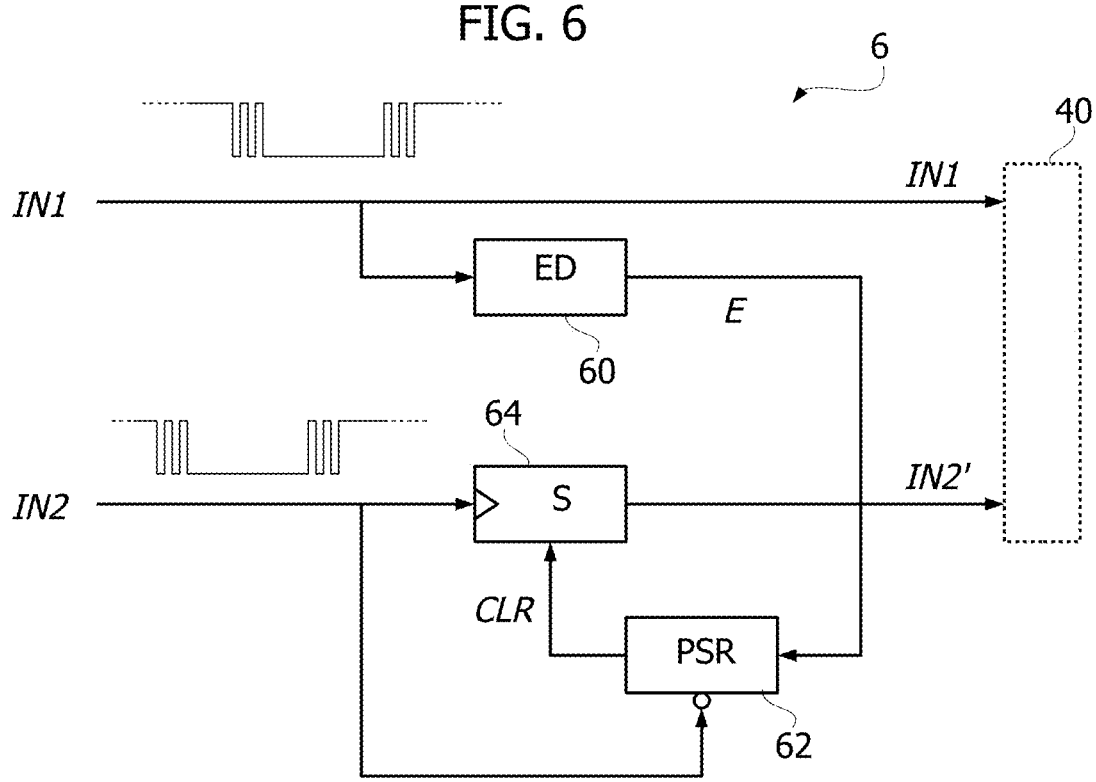
FIG. 6 is a circuit block diagram exemplary of a debouncing circuit suitable for use in debouncing quadrature signals, according to one or more embodiments of the present description.
Figure 7:
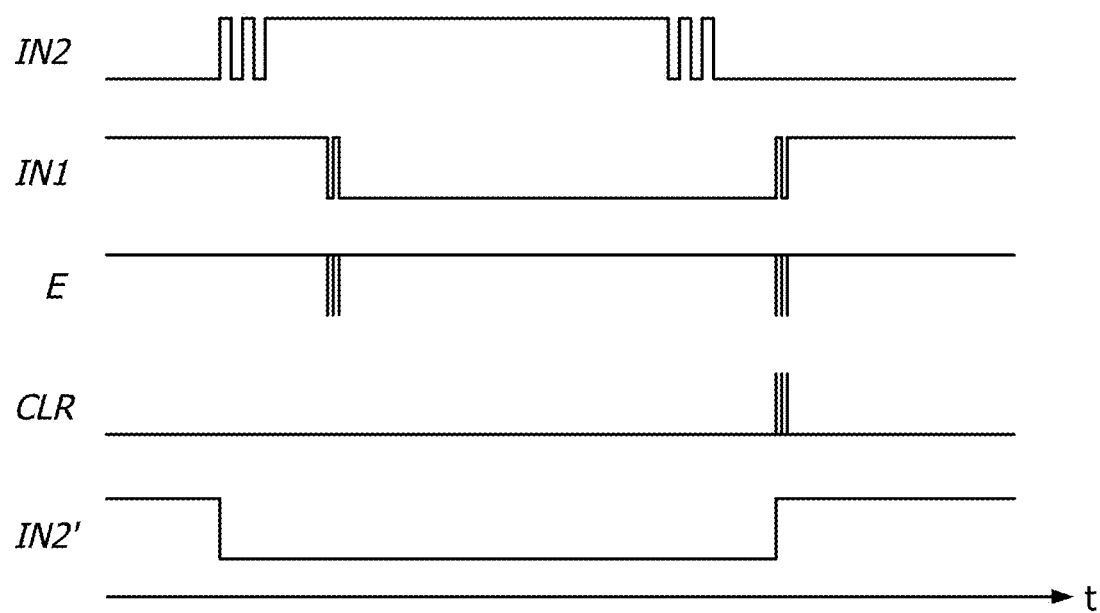
FIG. 7 is a time diagram exemplary of possible time evolution of signals in the debouncing circuit of FIG. 6.

FIG. 6 is a circuit block diagram exemplary of one or more embodiments of a debouncing circuit 6 suitable for debouncing quadrature signals. FIG. 7 is a time diagram exemplary of possible time evolution of signals in the debouncing circuit of FIG. 6. Operation of a debouncing circuit as exemplified in FIGS. 6 and 7 relies on the recognition that, by their nature, one of the two quadrature signals coming from a quadrature encoder (e.g., IN1) is stable when the other of the two quadrature signals (e.g., IN2) is subject to a transition (with possible bouncing), and vice versa. In other words, such embodiments rely on the inherent self-temporization of the quadrature signals.

In particular, the debouncing circuit 6 is configured to receive quadrature signals IN1 and IN2 possibly affected by bouncing effects (e.g., from a rotary encoder). The debouncing circuit 6 includes an edge detector circuit (ED) 60 configured to receive the first quadrature signal IN1 and produce a pulsed signal E indicative of the edges of signal IN1. For instance, as exemplified in FIG. 7, the pulsed signal E may be normally set to a default value and may be shortly asserted in response to each edge detected in signal IN1 (e.g., at both the rising edges and falling edges of signal IN1). In other words, the pulsed signal E may assert a pulse in response to each edge detected in signal IN1. By way of non-limiting example, as exemplified in FIG. 7, the default value of signal E may be a high logic value ('1') and its pulses may have a low logic value ('0'), but the opposite may be possible. The debouncing circuit 6 further includes a pulse skip and reset circuit (PSR) 62 configured to receive the second quadrature signal IN2 and the pulsed signal E, and to produce a reset (or clear) signal CLR indicative of a subset of the pulses of the pulsed signal E, in particular indicative of the pulses of the pulsed signal E produced (only) while the second quadrature signal IN2 is de-asserted. In other words, the pulse skip and reset circuit 62 substantially skips the pulses of the pulsed signal E produced while the second quadrature signal IN2 is asserted. By way of non-limiting example, as exemplified in FIG. 7, the reset signal CLR may be de-asserted while the second quadrature signal IN2 is asserted, and may correspond to the complement of the pulsed signal E (possibly slightly delayed) while the second quadrature signal IN2 is de-asserted. Still in other words, the reset signal CLR may be an inverted replica of the pulsed signal E, gated as a function of the second quadrature signal IN2. It is noted that, depending on the architecture of the debouncing circuit 6, the polarity of signal CLR could be inverted in one or more embodiments, depending on the surrounding logic: in other words, signal CLR may be a replica of the pulsed signal E, gated as a function of the second quadrature signal IN2. The debouncing circuit 6 further includes a sampling circuit (S) 64 configured to receive the second quadrature signal IN2 at a respective clock input and the reset signal CLR at a respective reset or clear input, and produce a debounced quadrature signal IN2'. For instance, as exemplified in FIG. 7, the debounced quadrature signal IN2' may be de-asserted (i.e., the sampling circuit 64 may be set) when a first rising edge is detected in the second quadrature signal IN2, and the debounced quadrature signal IN2' may be asserted (i.e., the sampling circuit 64 may be reset) when a first pulse is detected in the reset signal CLR. Again, it is noted that, depending on the architecture of the debouncing circuit 6, the polarity of signal IN2' could be inverted in one or more embodiments. By construction, the first reset pulse in the reset signal CLR is generated when the second quadrature signal IN2 is stable in a de-asserted state, because the reset pulses are generated at the transitions of the first quadrature signal IN1. Also, by construction, de-assertion of signal IN2 takes place when signal IN1 is stable.

It is again noted that, depending on the architecture of the debouncing circuit 6, the polarity of one or more of signals E, CLR and IN2' could be inverted in one or more embodiments. Additionally, it will be understood that the polarity of assertion and de-assertion, to which reference is made in the present description, may not be the same for all signals. For instance, the edge detector circuit 60 may generate a negative or positive assertion according to the downstream logic, e.g., depending on the designer's choice and/or on the automatic tool that optimizes the synthesized logic.

As exemplified in FIG. 6, the first quadrature signal IN1 and the debounced quadrature signal IN2' may then be propagated to a decoding circuitry (such as the decoding circuitry 40 exemplified in FIG. 4) operating in the x1 mode (i.e., using only the rising or falling edges of the debounced quadrature signal IN2' for generating the clock signal CLK for the counter 44).

Figure 8:
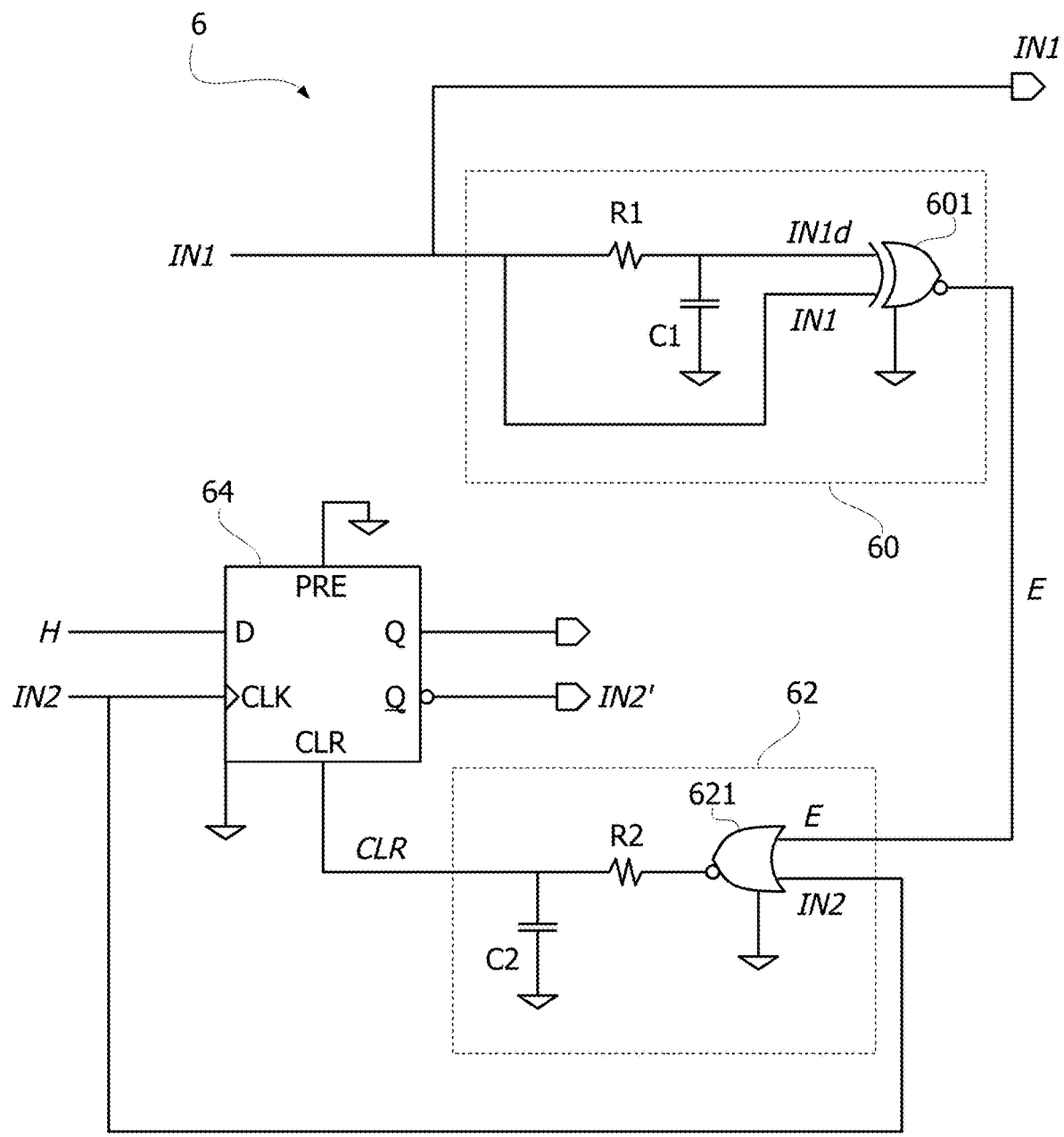
FIG. 8 is a circuit block diagram exemplary of a possible detailed implementation of the debouncing circuit of FIG. 6.

FIG. 8 is a circuit block diagram exemplary of a possible detailed implementation of the debouncing circuit 6 exemplified in FIG. 6.

In the example of FIG. 8, the edge detector circuit 60 includes a delay circuit (e.g., an analog delay circuit or a digital delay circuit) configured to produce a slightly delayed replica IN1$d$ of the first quadrature signal IN1. For instance, an analog delay circuit may comprise an RC filter circuit comprising a resistor R1 and a capacitor C1. By way of example, resistor R1 may have a resistance of about 100 kOhm and capacitor C1 may have a capacitance of about 200 nF. The edge detector circuit 60 further includes an exclusive logic gate 601 (e.g., an exclusive-NOR, XNOR) configured to receive the first quadrature signal IN1 and its delayed replica IN1$d$ to produce the pulsed signal E indicative of the edges of signal IN1 as previously discussed.

In the example of FIG. 8, the pulse skip and reset circuit 62 includes a logic gate 621 (e.g., a NOR logic gate)

configured to receive the second quadrature signal IN2 and the pulsed signal E to produce the reset signal CLR as previously discussed. Optionally, the reset signal CLR may be (slightly) delayed before being propagated to the sampling circuit 64, e.g., via a delay circuit (e.g., an analog delay circuit or a digital delay circuit), in order to properly clock the sampling circuit 64 when the second quadrature signal IN2 asserts before the reset signal CLR is disabled. For instance, an analog delay circuit may comprise an RC filter circuit comprising a resistor R2 and a capacitor C2. By way of example, resistor R2 may have a resistance of about 100 Ohm and capacitor C2 may have a capacitance of about 10 nF. Alternatively, a digital delay circuit may be implemented by cascading a certain number of logic gates (e.g., inverters, with the right overall polarity) in order to exploit the cumulative transmission delay of the chain.

In the example of FIG. 8, the sampling circuit 64 includes a D-type edge-triggered flip-flop (FF) having a data input (D) configured to receive a signal H having a fixed value (e.g., logic high), a clock input (CLK) configured to receive signal IN2 as the clock signal, a preset input (PRE) configured to receive a fixed value (e.g., logic low) opposite to the value of signal H, a clear input (CLR) configured to receive signal CLR as a clear signal, a first data output (Q), and a second data output (Q) configured to produce the debounced signal IN2' having the expected polarity. Depending on the polarity of the downstream logic, the first data output (Q) could be selected to produce the debounced signal. It is also noted that a different type of flip-flop circuit (e.g., a JK flip-flop) may be implemented in the sampling circuit 64, depending on the desired implementation. In general, the flip-flop is connected such as to assert an output signal IN2', (only) when it is out of reset, in response to an active edge of the respective clock signal which in this case is the second quadrature signal IN2, which in turn can be set by proper signal conditioning.

One or more embodiments as exemplified with reference to FIGS. 6, 7 and 8 may thus be advantageous insofar as their implementation relies on a simple (e.g., minimal) and fast logic. Additionally, in these embodiments the debouncing processing does not need a timer to be implemented. These embodiments may operate correctly even for high-speed applications, as long as the bouncing time interval is lower than 25% of the period of the quadrature signals IN1 and IN2. Additionally, these embodiments may self-adapt to pulse period changes (e.g., from standstill condition to low-speed movement to high-speed movement of the rotary encoder, which in the case of hand-driven rotary encoders or knobs may be typically limited to roughly one revolution per second). These embodiments may also be configured with a pre-conditioning logic (e.g., including a multiplexer and/or one or more inverters) placed upstream of the IN1 and IN2 inputs, for instance, in order to condition the polarity of the input signal(s) to change the leading edge polarity, or to multiplex different channels, etc.

In general, it is to be noted that the detailed implementation exemplified in FIG. 8 represents a possible embodiment of the present disclosure, which could be subject to various modifications without departing from the scope of the present application, regarding for instance the choice of the assertion/de-assertion polarity of signals, the choice of an alternative sampling circuit 64, the choice of alternative implementations for the logic circuitry in the edge detector circuit 60 and/or in the pulse skip and reset circuit 62, and the like.

Other embodiments will now be described, which rely on operation of a timer circuit for controlling the debouncing processing of quadrature signals IN1 and/or IN2.

Figure 9:
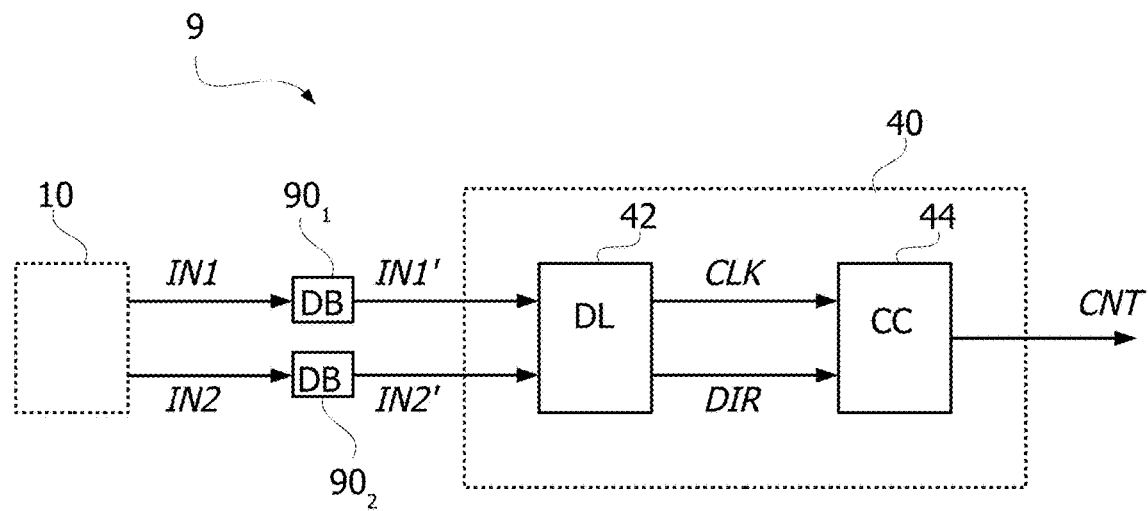
FIG. 9 is a circuit block diagram exemplary of decoding circuitry configured to debounce and decode signals produced by a rotary encoder, according to one or more embodiments of the present description.
Figure 10:
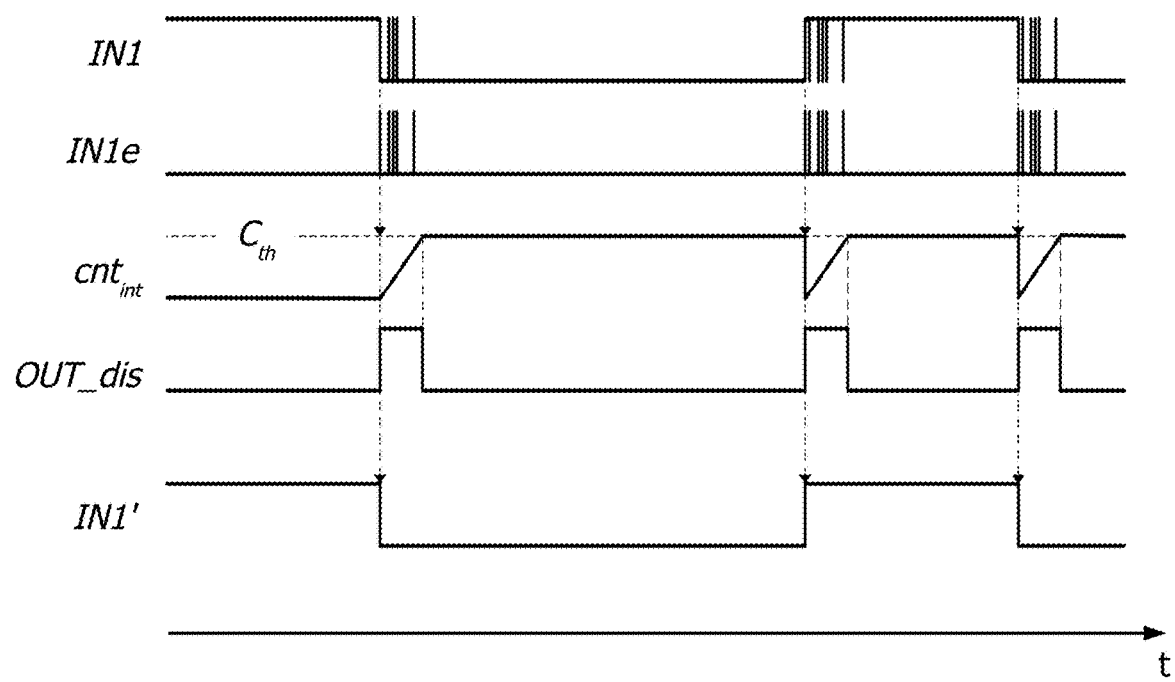
FIG. 10 is a time diagram exemplary of possible time evolution of signals in the decoding circuitry of FIG. 9.

FIG. 9 is a circuit block diagram exemplary of decoding circuitry 9 configured to debounce and decode signals produced, for example, by a rotary encoder. FIG. 10 is a time diagram exemplary of possible time evolution of signals in the decoding circuit of FIG. 9.

As exemplified in FIGS. 9 and 10, decoding circuitry 9 includes a decoder 40 substantially as disclosed with reference to FIG. 4. Additionally, the decoding circuitry 9 includes a first debouncer (DB) circuit $90_1$ coupled between the first output channel of the rotary encoder 10 and the first input of decoder 40 to debounce signal IN1 and produce a first debounced signal INF, and a second debouncer (DB) circuit $90_2$ coupled between the second output channel of the rotary encoder 10 and the second input of decoder 40 to debounce signal IN2 and produce a second debounced signal IN2'.

Each of the debouncer circuits $90_1$ and $90_2$ may include (e.g., consist of) a single-shot non-retriggerable counter, which substantially operates as a timer. FIG. 10 exemplifies possible operation of the first debouncer circuit $90_1$ (the same applying also to the second debouncer circuit $90_2$). The debouncer circuit $90_1$ receives the quadrature signal IN1, possibly affected by bouncing effects. The debouncer circuit $90_1$ includes an edge detector that produces a pulsed signal IN1e indicative of the rising and/or falling edges detected in the first quadrature signal IN1. For instance, the pulsed signal IN1e may be normally de-asserted and may include a short positive pulse (i.e., it may be briefly asserted) in response to each edge detected in signal IN1 (e.g., at both the rising edges and falling edges of signal IN1). Also in this case, as previously discussed, the polarity of signal IN1e may be inverted in one or more embodiments. The single-shot non-retriggerable counter of circuit $90_1$ is started in response to a first pulse being detected in the pulsed signal IN1e, and counts (see the counter value $cnt_{int}$ in FIG. 10) at a constant rate until reaching a determined (e.g., predetermined) stop value or threshold value $C_{th}$. While the counter is not counting (i.e., it has not been triggered, or it has already reached its threshold value $C_{th}$), the debouncer circuit $90_1$ passes (e.g., in a transparent way) the input quadrature signal IN1 to the output. To the contrary, while the counter is counting (i.e., between the first detected pulse of signal IN1e and the moment when the threshold value $C_{th}$ is reached), the output of the debouncer circuit $90_1$ is prevented from changing value (e.g., any change at the output is inhibited): see signal OUT_dis in FIG. 10, which when asserted prevents the output of the debouncer circuit $90_1$ from changing. Therefore, additional edges in signal IN1 that follow the first detected edge are ignored (e.g., not passed to the output of circuit $90_1$) until the counter reaches the threshold value $C_{th}$, and the output signal IN1' of the debouncer circuit $90_1$ is thereby debounced. In other words, the counter operates as a timer that inhibits any output change during a (pre)defined time interval following the first detected edge in the input signal IN1. After reaching the threshold value $C_{th}$, the counter is reset and starts counting again (e.g., from zero) in response to detection of another pulse in the pulsed signal IN1e.

One or more embodiments as exemplified with reference to FIGS. 9 and 10 may thus be advantageous insofar as the output signals IN1' and IN2' of the debouncer circuits $90_1$ and $90_2$ are in-phase (e.g., not delayed) with respect to the respective input signals IN1 and IN2. A single clock cycle delay may be present (e.g., a propagation delay due to the synchronous design of the debouncing circuitry), but this may be negligible compared to the timing of the input signal (e.g., 10 ns delay in the case of a 100 MHz design). Advantageously, these embodiments allow for running the decoder in the x4 mode, thus using the full encoder resolution.

In the embodiments disclosed with reference to FIGS. 9 and 10, the debouncing window (time interval) may have a fixed duration, e.g., the threshold value $C_{th}$ may be fixed and may not vary with the clock rate of the encoder. Since the useful bouncing period may happen to be longer than the debouncing window, particularly at a low rotation rate of the encoder 10, other embodiments will now be described, where the duration of the debouncing window may be adjusted (e.g., continuously and dynamically).

Figure 11:
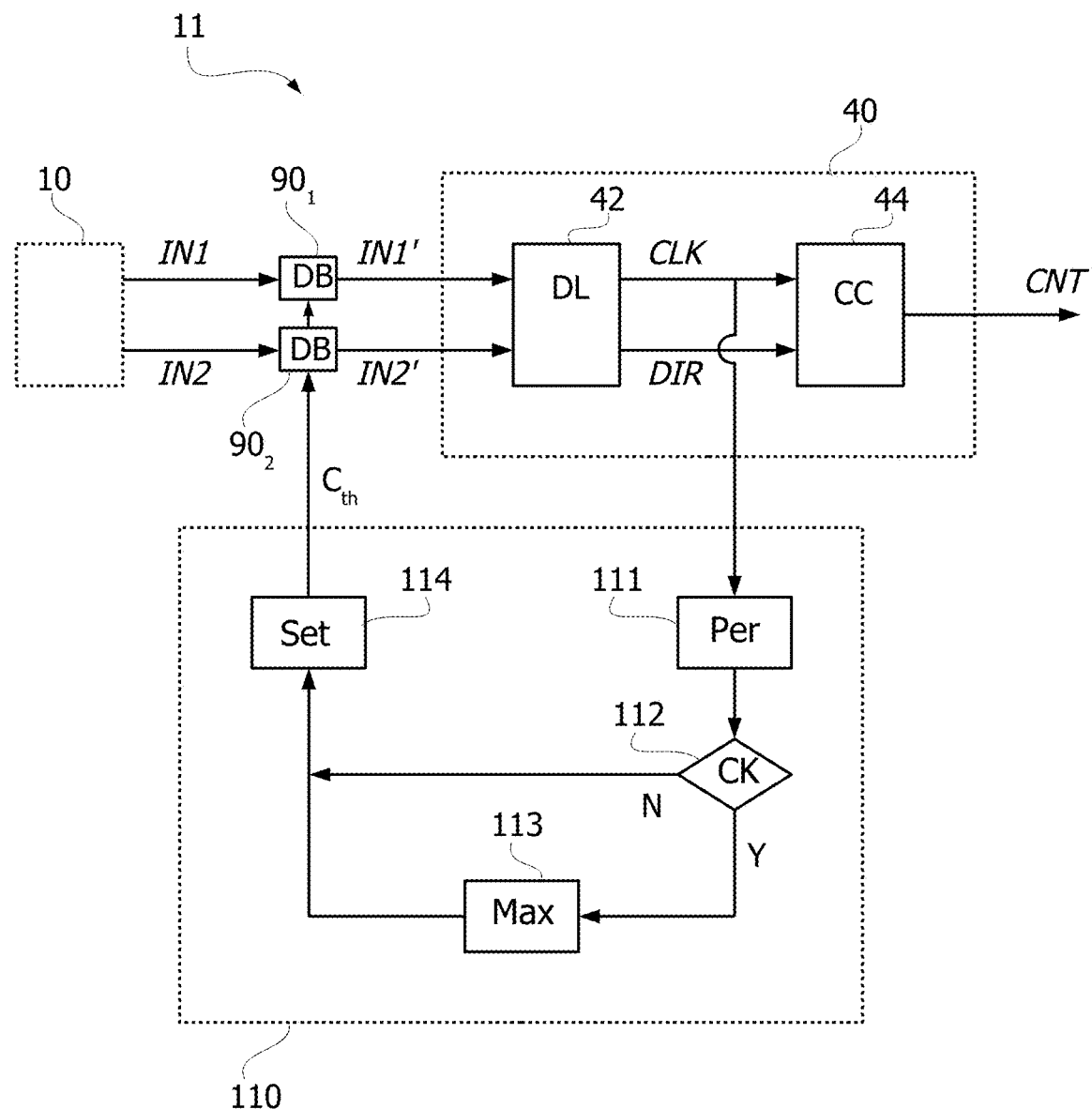
FIG. 11 is another circuit block diagram exemplary of decoding circuitry configured to debounce and decode signals produced by a rotary encoder, according to one or more embodiments of the present description.
Figure 12:
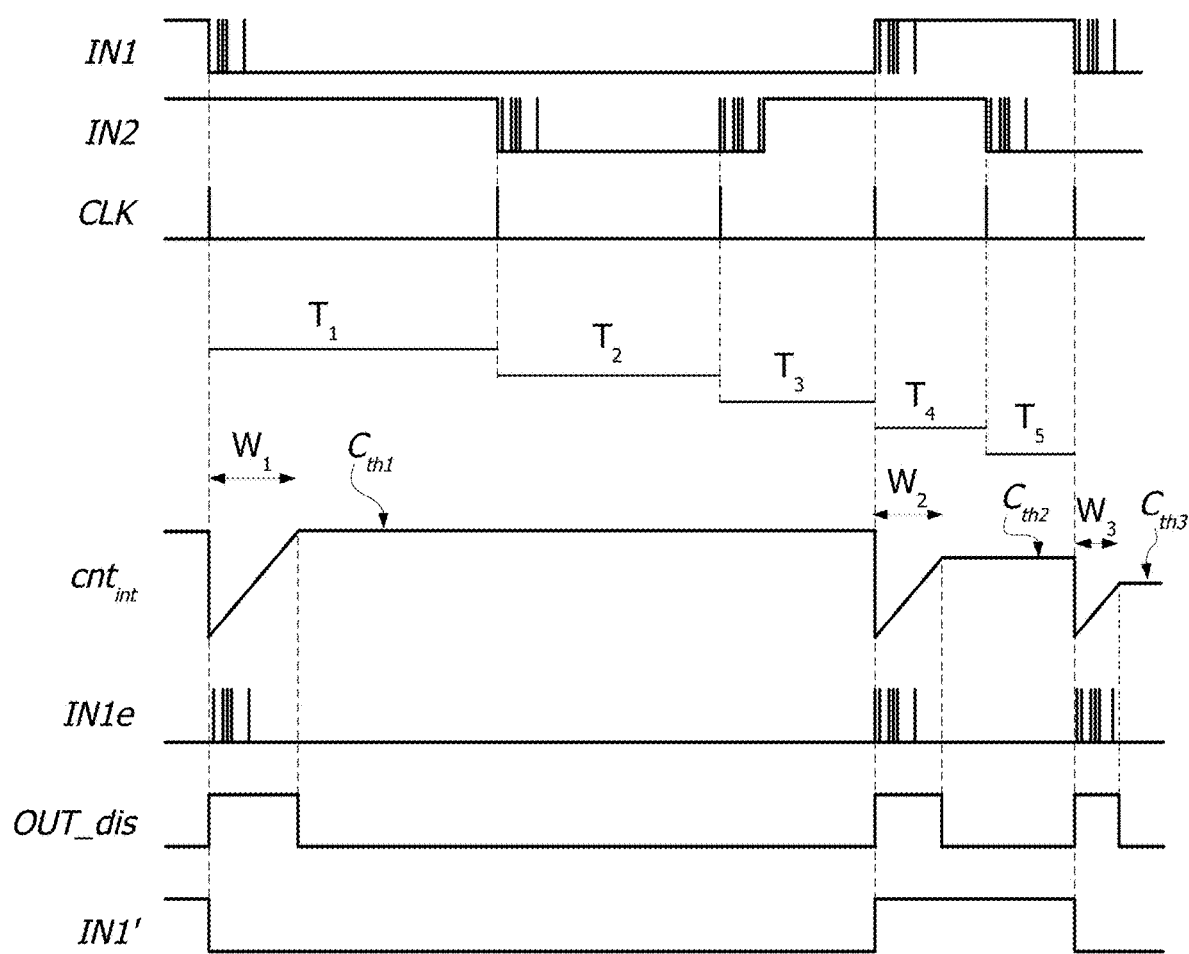
FIG. 12 is a time diagram exemplary of possible time evolution of signals in the decoding circuitry of FIG. 11.

FIG. 11 is a circuit block diagram exemplary of decoding circuitry 11 configured to debounce and decode signals produced, for example, by a rotary encoder, wherein the duration of the debouncing window is adjustable. FIG. 12 is a time diagram exemplary of possible time evolution of signals in the decoding circuit of FIG. 11.

As exemplified in FIGS. 11 and 12, decoding circuitry 11 includes a decoder 40 substantially as disclosed with reference to FIG. 4, as well as debouncer circuits $90_1$ and $90_2$ coupled to each channel of the rotary encoder 10. Additionally, the decoding circuitry 11 includes a debouncing period adjustment circuit 110 configured to control the debouncer circuits $90_1$ and $90_2$ so that the respective threshold values $C_{th}$ (and thus, the duration of the debouncing windows) are adapted (e.g., dynamically, "on-the-fly") as a function of the period of the clock signal CLK.

As exemplified in FIGS. 11 and 12, circuit 110 is configured to sense the clock signal CLK output by the decoding logic circuit 42. At an operation step (Per) 111, circuit 110 is configured to measure a period of the clock signal CLK. For instance, the period may be computed as the time interval between the last two detected pulses of the clock signal CLK. Additionally or alternatively, the period may be computed as an average value over several periods of the clock signal CLK (e.g., a rolling average or moving average). At an operation step (ck) 112 (which may be executed contextually with step 111, e.g., during the clock period measurement), circuit 110 is configured to check whether a timeout has elapsed (e.g., in case the rotary encoder is in a standstill condition or moving very slowly, and the clock signal CLK does not contain any pulse or few pulses). In response to a positive outcome (Y) of step 112 (i.e., if the measured period exceeds the timeout interval), the measured clock period $T_{MEAS}$ is set to a certain maximum value $T_{MAX}$ (i.e., the measured clock period $T_{MEAS}$ is capped to $T_{MAX}$) at an operation step (max) 113. Otherwise, in response to a negative outcome (N) of step 112 (i.e., if the measured period is shorter than the timeout interval), the measured clock period $T_{MEAS}$ is maintained to its measured value. At an operation step (set) 114, circuit 110 is configured to set the current value of the counter threshold $C_{th}$ as a function of the measured clock period $T_{MEAS}$. For instance, the counter threshold $C_{th}$ may be set so that the counter in circuit $90_1$ takes a time $T_{count}$ equal to a certain percentage (e.g., 25%) of the measured clock period $T_{MEAS}$ to count from its reset value (e.g., zero) to the threshold value $C_{th}$. By doing so, the output signal IN1' of debouncer circuit $90_1$ is prevented from changing its value for a time interval $T_{count}$ after each pulse of signal IN1e, with time interval $T_{count}$ being dynamically adapted.

For instance, as exemplified in FIG. 12, the single-shot non-retriggerable counter of circuit $90_1$ is started in response to a first pulse being detected in the pulsed signal IN1e, and counts over a time window $W_1$ at a constant rate until reaching a threshold value $C_{th1}$ that is a function of a previous period $T_0$ (not visible in FIG. 12). While the counter is counting, the output of the debouncer circuit $90_1$ is prevented from changing value (e.g., signal OUT_dis is asserted). After reaching the threshold value $C_{th1}$, the counter is reset and starts counting again (e.g., from zero) in response to detection of another pulse in the pulsed signal IN1e. In this case, the counter counts over a time window $W_2$ until reaching a threshold value $C_{th2}$ that is a function of the last measured clock period $T_3$ of signal CLK. For instance, $C_{th2}$ may be selected so that $W_2=0.25*T_3$ or $W_2=0.4*T_3$. When another pulse is detected in the pulsed signal IN1e, the counter counts over a time window $W_3$ until reaching a threshold value $C_{th3}$ that is a function of the last measured clock period $T_5$ of signal CLK. For instance, $C_{th3}$ may be selected so that $W_3=0.25*T_5$ or $W_3=0.4*T_5$. In other words, the counter of circuit $90_1$ operates as a timer that inhibits any output change during an adaptive time interval following the first detected edge in the input signal IN1, wherein the duration of the time interval is set as a function of one or more of the clock periods(s) of clock signal CLK.

Figure 13:
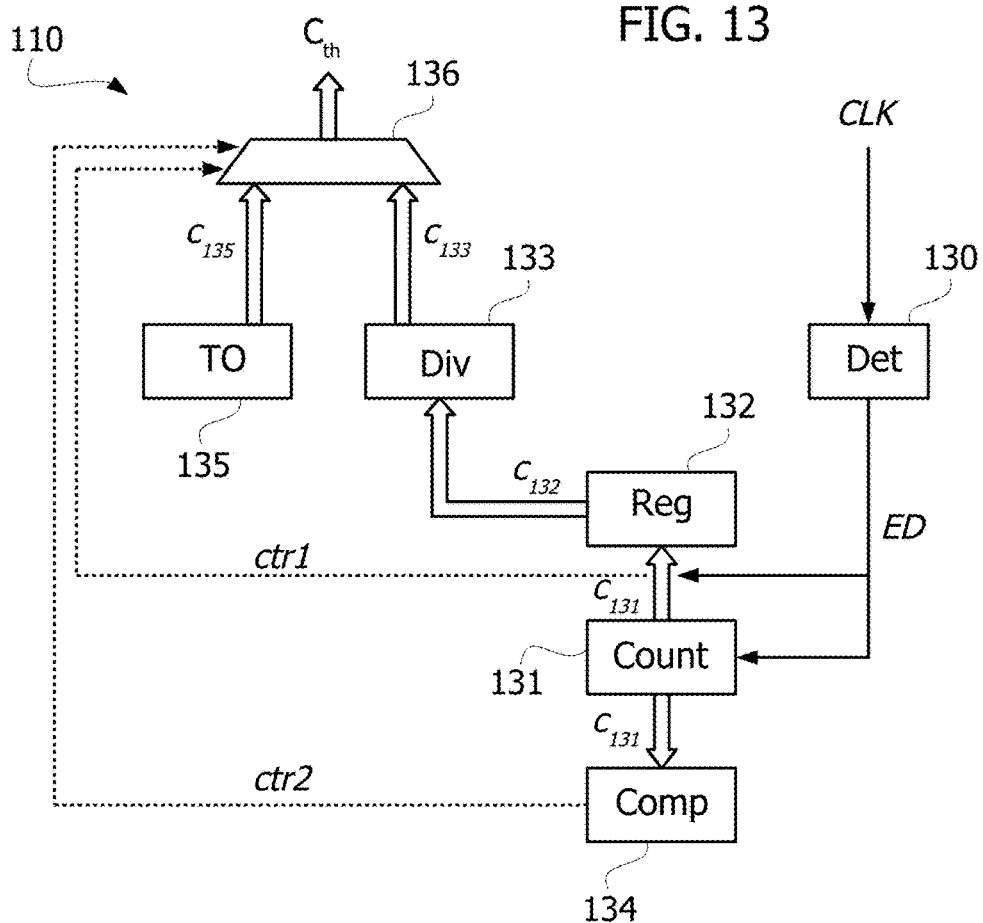
FIG. 13 is a circuit block diagram exemplary of a possible detailed implementation of the decoding circuitry of FIG. 11.
Figure 14:
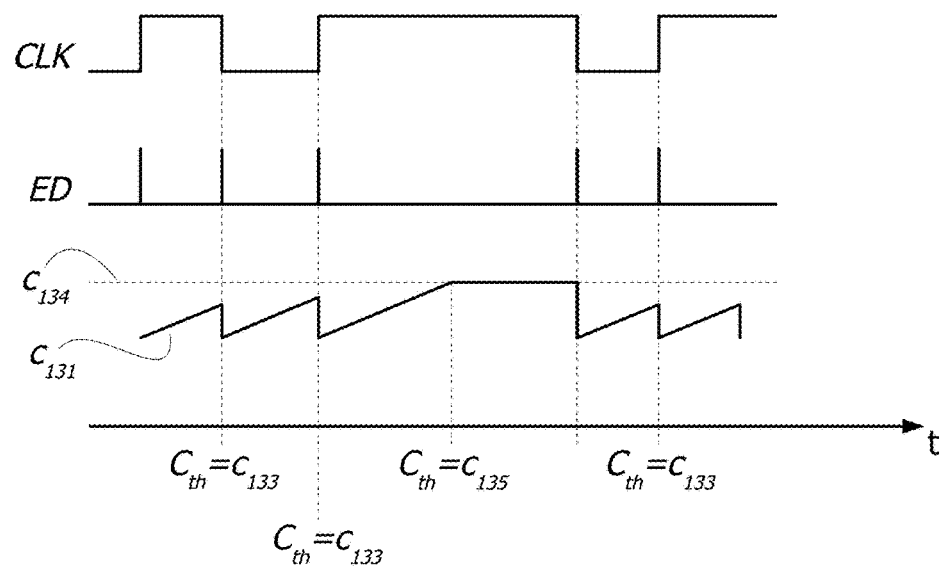
FIG. 14 is a time diagram exemplary of a possible time evolution of signals in the decoding circuitry of FIG. 13.

FIG. 13 is a circuit block diagram exemplary of possible implementation details of a debouncing period adjustment circuit 110, where the period of the clock signal CLK is computed as the time interval between the last two detected pulses of the clock signal CLK. FIG. 14 is a time diagram exemplary of possible time evolution of signals in the debouncing period adjustment circuit 110 of FIG. 13.

In the example of FIG. 13, the adjustment circuit 110 may include an edge detector (Det) 130 configured to receive the clock signal CLK and produce a pulsed signal ED indicative of the edges of the clock signal CLK (e.g., both rising and falling edges). Signal ED may thus comprise a pulse at each edge of signal CLK. Alternatively, if the clock signal CLK already includes (e.g., is composed of) a train of pulses (as disclosed, for instance, with reference to FIGS. 4 and 5), the edge detector 130 may be omitted, and signal ED may substantially correspond to the clock signal CLK. The adjustment circuit 110 includes a counter circuit (Count) 131 which receives signal ED and is configured to be reset and start counting (e.g., increasing an internal count number $c_{131}$) at each pulse in signal ED. Advantageously, the counter circuit 131 may operate at the same rate as the internal counter of circuits $90_1$ and $90_2$. The adjustment circuit 110 includes a capture register (Reg) 132 configured to capture (e.g., store) the value $c_{131}$ of the counter circuit 131 at each pulse in signal ED, before reset of the counter circuit 131. The adjustment circuit 110 comprises a divider circuit (Div) 133 (e.g., a shift register) configured to read the value $c_{132}$ stored in the capture register 132 and divide it to produce a divided value $c_{133}$. For instance, the divider 133 may implement a division by four (e.g., implementing a 2-bit right shift) or a division by two (e.g., implementing a 1-bit right shift). The adjustment circuit 110 comprises a comparator circuit (Comp) 134 configured to compare the value $c_{131}$ of the counter circuit 131 to a threshold value $c_{134}$. The adjustment circuit 110 comprises a multiplexer 136 configured to receive the output $c_{133}$ from the divider 133 as a first input and a timeout value $c_{135}$ from a timeout register (TO) 135 as a second input. The timeout value $c_{135}$ may be equal to the threshold value $c_{134}$ divided by the same division factor of divider 133 (e.g., $c_{135}=c_{134}/4$ or $c_{135}=c_{134}/2$). At the system start-up, the timeout value $c_{135}$ may be passed at the output of multiplexer 136 until a valid clock period measure is carried out by circuits 131 and 132. During operation, once a first valid clock period measure has been carried out, the multiplexer 136 is controlled by control signals ctr1, ctr2 issued by the capture register 132 and by the comparator circuit 134, respectively, so that: if both control signals ctr1 and ctr2 are de-asserted (indicating that the value $c_{132}$ stored in the capture register 132 is not valid and that the counter value $c_{131}$ has not reached the threshold value $c_{134}$) the multiplexer 136 keeps its output at the latest valid value; if control signal ctr2 is asserted (indicating that the counter value $c_{131}$ has reached the threshold value $c_{134}$) the multiplexer 136 passes the value $c_{135}$ stored in the timeout register 135 to its output, independently from the value of control signal ctr1; and if control signal ctr1 is asserted and control signal ctr2 is de-asserted (indicating that the value $c_{132}$ stored in the capture register 132 is valid and that the counter value $c_{131}$ has not reached the threshold value $c_{134}$) the multiplexer 136 passes the value $c_{133}$ output by the divider circuit 133 to its output. The value passed by the multiplexer 136 is received by circuits $90_1$ and/or $90_2$ to be used as the counter threshold $C_{th}$.

Figure 15:
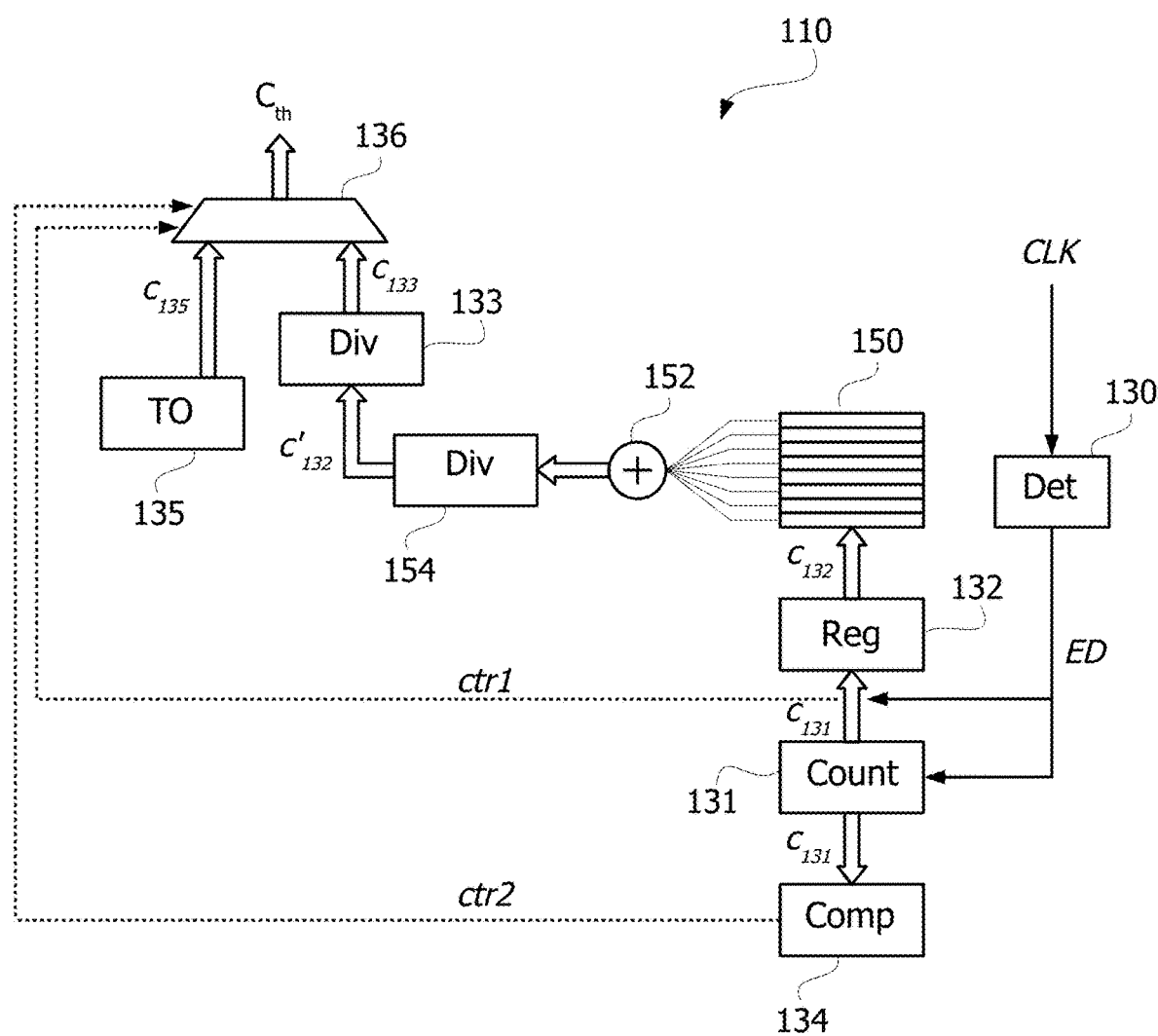
FIG. 15 is a circuit block diagram exemplary of a possible detailed implementation of the decoding circuitry of FIG. 11.

FIG. 15 is a circuit block diagram exemplary of possible implementation details of a debouncing period adjustment circuit 110, where the period of the clock signal CLK is computed as a rolling average value over several (e.g., eight) periods of the clock signal CLK.

Substantially, the example of FIG. 15 adds to the example of FIG. 13 a FIFO register 150 (e.g., an eight-level FIFO register), an adder circuit 152 and a divider circuit 154 (e.g., a divider by eight, possibly implemented by a 3-bit right shift register). The FIFO register 150 is coupled to the capture register 132 and is thus configured to store the last (e.g., eight) values $c_{132}$ output by the compare register 132. The adder circuit 152 adds all the values stored in the FIFO register 150, and the divider circuit 154 divides the value output by the adder circuit 152 to produce an average value c' 132 that is fed to the divider circuit 133, and then to the multiplexer 136.

One or more embodiments as exemplified with reference to FIGS. 11 to 15 may thus be further advantageous insofar as they provide a de-bouncing interval that auto-adapts to clock period changes, and thus to changes of the rotation speed of the rotary encoder (e.g., from a standstill condition to a low rotation speed to a high rotation speed).

It is noted that, while various embodiments have been exemplified in FIGS. 9 to 15 where a debouncer circuit is associated with (e.g., coupled to) each channel of the rotary encoder so as to debounce both quadrature signals IN1 and IN2 and allow the decoder circuitry to operate in the high-resolution x4 mode, one or more embodiments may comprise a single debouncer circuit associated with only one of the encoder channels, still allowing the decoder circuitry to operate in the lower resolution modes x2 and x1.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A circuit, comprising:
a first input node configured to receive a first input signal;
a second input node configured to receive a second input signal;
wherein said first input signal and said second input signal are in quadrature phase;
an edge detector circuit configured to receive said first input signal and produce a pulsed signal including a pulse for each edge detected in said first input signal;
a pulse skip and reset circuit configured to receive said pulsed signal and said second input signal, and produce a reset signal which includes only those pulses in said pulsed signal which occur when said second input signal is de-asserted; and
a sampling circuit configured to generate an output signal that is de-asserted in response to assertion of said second input signal and is asserted in response to a pulse of said reset signal.

2. The circuit of claim 1, wherein said pulsed signal produced by the edge detector circuit is maintained in a normally de-asserted state and is asserted by a signal pulse in response to rising edges and falling edges detected in said first input signal.

3. The circuit of claim 1, wherein said reset signal produced by the pulse skip and reset circuit is maintained in a normally de-asserted state and is asserted by a signal pulse in response to each signal pulse of said pulsed signal while said second input signal is de-asserted.

4. A circuit, comprising:
a first input node configured to receive a first input signal;
a second input node configured to receive a second input signal;
wherein said first input signal and said second input signal are in quadrature phase;
an edge detector circuit configured to receive said first input signal and produce a pulsed signal indicative of edges detected in said first input signal;
a pulse skip and reset circuit configured to receive said pulsed signal and said second input signal, and produce a reset signal indicative of pulses detected in said pulsed signal while said second input signal is de-asserted; and
a sampling circuit configured to generate an output signal that is de-asserted in response to assertion of said second input signal and is asserted in response to a pulse of said reset signal;
wherein said edge detector circuit comprises:
a delay circuit configured to produce a delayed replica of said first input signal; and
a logic circuit configured to apply one of exclusive-NOR signal processing or exclusive-OR signal processing to said first input signal and said delayed replica of said first input signal to produce said pulsed signal.

5. The circuit of claim 4, wherein said pulsed signal produced by the edge detector circuit is maintained in a normally de-asserted state and is asserted by a signal pulse in response to rising edges and falling edges detected in said first input signal.

6. The circuit of claim 4, wherein said reset signal produced by the pulse skip and reset circuit is maintained in a normally de-asserted state and is asserted by a signal pulse in response to each signal pulse of said pulsed signal while said second input signal is de-asserted.

7. A circuit, comprising:
a first input node configured to receive a first input signal;
a second input node configured to receive a second input signal;
wherein said first input signal and said second input signal are in quadrature phase;
an edge detector circuit configured to receive said first input signal and produce a pulsed signal indicative of edges detected in said first input signal;

a pulse skip and reset circuit configured to receive said pulsed signal and said second input signal, and produce a reset signal indicative of pulses detected in said pulsed signal while said second input signal is de-asserted; and a sampling circuit configured to generate an output signal that is de-asserted in response to assertion of said second input signal and is asserted in response to a pulse of said reset signal;

wherein said pulse skip and reset circuit comprises a logic circuit configured to apply one of NOR signal processing or OR signal processing to said pulsed signal and said second input signal to produce said reset signal.

8. The circuit of claim 7, wherein said pulsed signal produced by the edge detector circuit is maintained in a normally de-asserted state and is asserted by a signal pulse in response to rising edges and falling edges detected in said first input signal.

9. The circuit of claim 7, wherein said reset signal produced by the pulse skip and reset circuit is maintained in a normally de-asserted state and is asserted by a signal pulse in response to each signal pulse of said pulsed signal while said second input signal is de-asserted.

10. A circuit, comprising:
a first input node configured to receive a first input signal;
a second input node configured to receive a second input signal;
wherein said first input signal and said second input signal are in quadrature phase;
an edge detector circuit configured to receive said first input signal and produce a pulsed signal indicative of edges detected in said first input signal;
a pulse skip and reset circuit configured to receive said pulsed signal and said second input signal, and produce a reset signal indicative of pulses detected in said pulsed signal while said second input signal is de-asserted; and
a sampling circuit configured to generate an output signal that is de-asserted in response to assertion of said second input signal and is asserted in response to a pulse of said reset signal;
wherein said sampling circuit comprises a flip-flop having a clock input terminal configured to receive said second input signal, a clear input terminal configured to receive said reset signal, a data input terminal configured to receive a data input signal having a fixed logic value, at a preset input terminal configured to receive a preset input signal having a fixed logic value, and a data output terminal configured to produce said output signal.

11. The circuit of claim 10, wherein said pulsed signal produced by the edge detector circuit is maintained in a normally de-asserted state and is asserted by a signal pulse in response to rising edges and falling edges detected in said first input signal.

12. The circuit of claim 10, wherein said reset signal produced by the pulse skip and reset circuit is maintained in a normally de-asserted state and is asserted by a signal pulse in response to each signal pulse of said pulsed signal while said second input signal is de-asserted.

13. A circuit, comprising:
an input configured to receive first and second periodic digital signals in phase quadrature having a frequency indicative of speed of mechanical rotation and phase relationship indicative of direction of mechanical rotation;
an edge detector circuit configured to detect edges of the first periodic digital signal and produce a signal pulse for each detected edge;
a pulse skip and reset circuit configured to generate a reset signal which includes only those signal pulses output from the edge detector circuit which occur when the second periodic digital signal is de-asserted; and
a set/reset circuit having a set input configured to receive the second periodic digital signal and set an output signal to a first logic state in response thereto, and a reset input configured to receive the reset signal and reset the output signal to a second logic state in response thereto.

14. The circuit of claim 13, further comprising a rotary encoder circuit configured to generate the first and second periodic digital signals.

15. The circuit of claim 13, further comprising a processing circuit configured to receive the first periodic digital signal and the output signal, said processing circuit operating to decode the first periodic digital signal and the output signal.

16. A method, comprising:
receiving a first input signal;
receiving a second input signal;
wherein said first input signal and said second input signal are in quadrature phase;
producing a pulsed signal including a pulse for each edge detected in said first input signal;
producing a reset signal which includes only those pulses in said pulsed signal which occur when said second input signal is de-asserted; and
producing an output signal that is de-asserted in response to assertion of said second input signal and is asserted in response to a pulse being detected in said reset signal.

17. The method of claim 16, wherein producing said pulsed signal comprises:
maintaining the pulse signal in a normally de-asserted state; and
asserting said pulsed signal by a signal pulse in response to rising edges and falling edges in said first input signal.

18. The method of claim 16, wherein producing said reset signal comprises:
maintaining the reset signal in a normally de-asserted state; and
asserting said reset signal by a signal pulse in response to each signal pulse of said pulsed signal while said second input signal is de-asserted.

* * * * *